United States Patent [19]

Inokuchi et al.

[11] Patent Number: 5,901,096
[45] Date of Patent: May 4, 1999

[54] SEMICONDUCTOR MEMORY DEVICE CAPABLE OF DISCONNECTING AN INTERNAL BOOSTER POWER SUPPLY FROM A SELECTED WORD LINE IN RESPONSE TO A TEST SIGNAL AND TESTING METHOD THEREFOR

[75] Inventors: Toshihiro Inokuchi; Makoto Kojima, both of Osaka, Japan

[73] Assignee: Matsushita Electric Industrial Co., Ltd., Osaka, Japan

[21] Appl. No.: 09/034,353

[22] Filed: Mar. 4, 1998

[30] Foreign Application Priority Data

Mar. 5, 1997 [JP] Japan ..................................... 9-050323

[51] Int. Cl.$^6$ .................................................. G11C 29/00
[52] U.S. Cl. .................... 365/201; 365/189.09; 365/228; 365/230.06; 365/195
[58] Field of Search ............................. 365/201, 189.09, 365/228, 230.06, 195

[56] References Cited

U.S. PATENT DOCUMENTS 5,642,315  6/1997  Yamaguchi ......................... 365/189.09
5,675,539  10/1997  Mirabel et al. ..................... 365/185.25

FOREIGN PATENT DOCUMENTS

04252488  9/1992  Japan .

*Primary Examiner*—David Nelms
*Assistant Examiner*—Andrew Q. Tran
*Attorney, Agent, or Firm*—McDermott, Will & Emery

[57] ABSTRACT

There is provided disconnecting circuit for disconnecting an internal boosted power supply from a word line. At the time of testing, one of a plurality of word lines is selected therefrom and data on the "Low" level is written in a plurality of memory cells connected to the selected word line. Thereafter, the disconnecting circuit is activated such that the selected word line has high impedance. When there is a leakage current flowing from the word line due to a defect, the potential on the word line lowers rapidly after the word line is disconnected from the internal boosted power supply. Consequently, the data cannot be written properly in the memory cells any more. After a specified period of time has elapsed, data on the "High" level is written sequentially in the memory cells connected to the selected word line. Then, the same word line is selected again such that the data written in the memory cells connected to the word line is read therefrom. If the read data is on the "Low" level and erroneous, it follows that the data on the "High" level has not been written successfully. Therefore, it is judged that there is a leakage current flowing from the word line. In this manner, both testing time and testing cost can be reduced. Since a minimal leakage current that has conventionally been difficult to detect can be detected, testing ensures the removal of a potential defect becoming more evident as the semiconductor memory deteriorates with time.

13 Claims, 7 Drawing Sheets

SEMICONDUCTOR MEMORY DEVICE CAPABLE OF DISCONNECTING AN INTERNAL BOOSTER POWER SUPPLY FROM A SELECTED WORD LINE IN RESPONSE TO A TEST SIGNAL AND TESTING METHOD THEREFOR

BACKGROUND OF THE INVENTION

The present invention relates to an improved semiconductor memory and to an improved testing method therefor.

Figure 2:
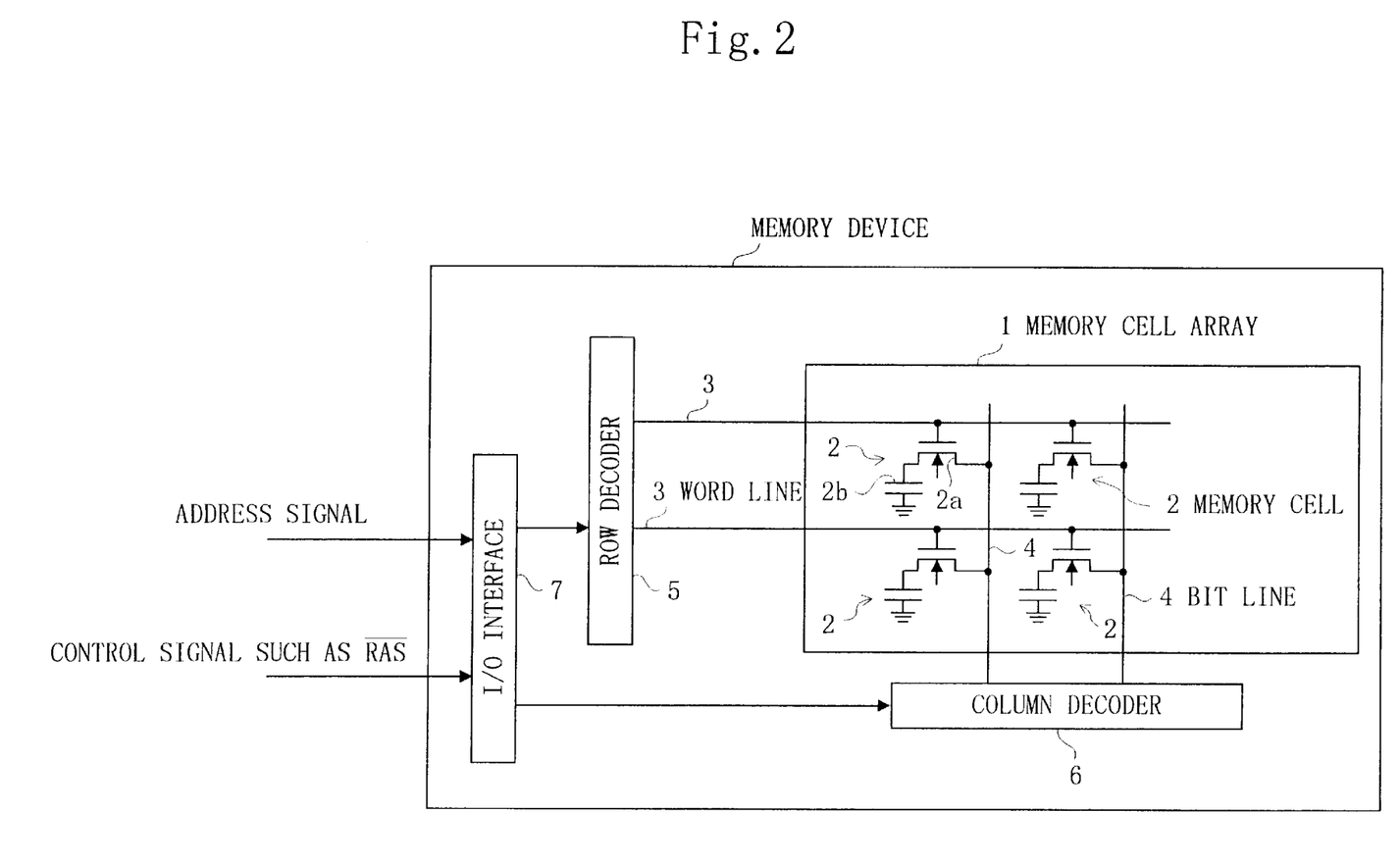
FIG. 2 schematically shows an overall structure of the semiconductor memory.

A typical semiconductor memory as shown in FIG. 2 has a memory cell array 1 consisting of a large number of memory cells 2 (though only four are shown in the drawing) arranged in rows and columns. Each of the memory cells 2 has a memory cell transistor 2a and a memory cell capacitor 2b. In a DRAM (Dynamic RAM), the memory cell transistor 2a is composed of an N-channel MOS transistor. Word lines 3 (only two are shown in the drawing) are provided for the individual rows of the memory cell array 1 such that the memory cells 2 aligned in each of the rows are connected to the corresponding one of the word lines 3. Bit lines 4 (only two are shown in the drawing) are provided for the individual columns of the memory cell array 1 such that the memory cells 2 aligned in each of the columns are connected to the corresponding one of the bit lines 4. A row decoder 5 selects among the word lines 3, while a column decoder 6 selects among the bit lines 4. An I/O interface 7 is connected to each of the decoders 5 and 6 to receive an address signal for specifying the word line 3 and bit line 4 to be selected and a control signal such as /RAS (Row Address Strobe).

The DRAM has used a circuit for boosting a potential on the selected word line over an external power-supply voltage to prevent a write voltage supplied to the memory cell from lowering due to the threshold voltage of the gate of the N-channel MOS memory cell transistor 2a.

To boost the potential on the selected word line over the power-supply voltage, there has been used a conventional method wherein a voltage is boosted by using a capacitor in activating the word line, i.e., in generating a word-line drive signal so that the voltage level of the word-line drive signal is thereby boosted over the power-supply voltage.

In accordance with the conventional method wherein the voltage is boosted by using the capacitor only when the word-line drive signal is generated, the word-line drive signal is disconnected from a power supply and placed in a floating state when the voltage level of the word-line drive signal has been boosted over the power-supply voltage as a result of voltage boosting performed by using the capacitor. However, if there is a leakage current resulting from a defect and allowed to flow from the word line to another node, the potential on the word line lowers, which prevents the writing of data in the memory cell. To avoid this, an additional word-line-potential holding circuit may also be provided to hold the word-line potential on the "High" level by pumping the word-line drive signal to such a degree as to compensate for the leakage current.

In this case, if the leakage current is slightly larger in quantity than the current supplied by pumping for holding the potential on the word line, the voltage on the word line may gradually lower since pumping is constantly performed when the word line is active. Although such a memory should be judged faulty and removed as a result of testing, testing requires a cycle time equal to or longer than a maximum cycle time defined in specifications, which increases a testing time as well as testing cost. Even when the leakage current is slightly smaller in quantity than the supplied current, if the leakage current has been caused by a defect resulting from a broken oxide film or the like, the defect has the potential to increase the leakage current, cause malfunction, and degrade the reliability of the product as it deteriorates with time.

To overcome the problem, Japanese Unexamined Patent Publication No. 4-252488, for example, has proposed a method wherein the operation of the word-line-potential holding circuit is halted at the time of testing by an additional circuit which uses a test signal to halt the operation of an oscillator for pumping.

On the other hand, there has recently been adopted a method wherein a word-line drive signal is generated by using an internal boosted power supply obtained by preliminary pumping, which is for eliminating a delay in operating speed resulting from voltage boosting performed by using a capacitor on the rising edge of the word-line drive signal. The method provides an increased operating speed, since voltage boosting has been performed by using the capacitor prior to the rising edge of the word-line drive signal and hence it is no more necessary to perform voltage boosting by using the capacitor on the rising edge of the word-line drive signal.

In accordance with the method wherein the word-line drive signal is generated by using the internal boosted power supply obtained by preliminarily generating a boosted voltage by pumping, the boosted power supply may have sufficiently high current drive capability so that a defect resulting from the leakage current flowing from the word line as described above need not be considered conventionally.

OBJECT OF THE INVENTION

However, if an operating current is to be reduced because of a long cycle time or the like, even the method of generating the word-line drive signal by using the internal boosted power supply obtained by preliminarily generating a boosted voltage by pumping requires the minimization of a pumping current when the word line remains in the active state for a long duration of time. Consequently, the current drive capability of the boosted power supply when the word line remains in the active state for a long duration of time should be minimized to barely compensate for a potential drop on the word line caused by normal junction leakage or the like. Hence, even in the method of generating a word-line drive signal by using the internal boosted power supply, there may be a case where a leakage current is slightly larger in quantity than the current supplied by pumping for holding the potential on the word line, so that a memory having the potential to become faulty because of a gradually lowering voltage should be removed by testing. In addition, it is important to remove the faulty memory by a test shorter in cycle time in terms of testing cost. There may also be a case where the leakage current is slightly smaller in quantity than the supplied current. In this case, the leakage current may increase with time and cause malfunction, which degrades the reliability of the product. Hence, such a faulty memory should also be removed by testing.

However, in the method of generating the word-line drive signal by using the internal boosted power supply, the output capacitance of the internal boosted power supply is as large as about 800 pF in a 16 Mb class DRAM, e.g., so that the potential on the word line is maintained for a certain period of time by charges accumulated in the output capacitance of the internal boosted power supply even after the operation of a voltage boosting circuit is halted. As a result, the potential drop on the word line requires some time till it is detected by testing. In a 16 Mb DRAM, for example, the capacitance of a word line is on the order of 2.3 pF and the output capacitance of an internal boosted power supply is on the order of 800 pF. For the following discussion, it is assumed that a leakage current of 1 $\mu$A is flowing from the word line and that a potential drop of 1.6 V on the word line results in erroneous writing. By detecting the erroneous writing, such a faulty memory can be removed by testing (thus far, the description has been given based on the assumption that the potential on the bit line is 3.3 V and data on the "High" level can be written in a memory cell as long as the written potential is approximately 1.65 V or higher). Accordingly, the time required for testing, i.e., time required by the word-line potential to lower till erroneous writing occurs is about 1.3 ms.

Moreover, since the output capacitance of the internal boosted power supply is large, the method of halting pumping at the time of testing presents the problem that, once pumping is halted and an output voltage from the internal boosted power supply lowers, considerable time is required to restore the output voltage to a specified level in the subsequent cycle of operation.

Furthermore, if the method of halting the pumping of the internal boosted power supply is applied to a recent large-capacity DRAM in which a memory cell array is divided into a large number of blocks to allow a plurality of word lines contained in different blocks to be selected simultaneously, the internal boosted power supply is used in common by all the blocks, so that potentials are reduced on all the word lines contained in different blocks and selected simultaneously. This prevents a word line in question with a leakage current from being specified in a test, which is also disadvantageous in replacing defective rows with redundant rows.

It is therefore an object of the present invention to provide a semiconductor memory using an internal boosted power supply to boost a potential on a selected word line over a power-supply voltage and a testing method therefor which allows the semiconductor memory to be tested in a shorter period of time for a defect resulting from a leakage current flowing from the word line to another node.

SUMMARY OF THE INVENTION

To attain the object, the present invention disconnects the internal boosted power supply from a word line under test such that the word line has high impedance and thereby accelerates a potential drop on the word line due to the leakage current.

A semiconductor memory according to the present invention comprises: a memory cell array having a large number of memory cells arranged in rows and columns; a plurality of word lines provided for the individual rows of the memory cell array, each of the word lines being connected to those of the memory cells arranged in one of the rows; an internal boosted power supply having a boosted voltage obtained by preliminarily boosting a power-supply voltage; a word-line drive signal line connected to the internal boosted power supply when any of the word lines is active; a word driver for connecting, when one of the plurality of word lines is selected therefrom based on a row address, the word-line drive signal line to the selected word line; and disconnecting means for disconnecting the internal boosted power supply from the selected word line in response to a test signal after the word line is selected.

In the semiconductor memory according to the present invention, the disconnecting means disconnects the internal boosted power supply from the word-line drive signal line.

In the semiconductor memory according to the present invention, the disconnecting means disconnects the word-line drive signal line from the selected word line.

The semiconductor memory according to the present invention further comprises a test-signal generating circuit for generating the test signal in synchronization with the selection of a specified column address.

Additionally, a testing method for a semiconductor memory according to the present invention comprises the steps of: when one of a plurality of word lines is selected therefrom, connecting an internal boosted power supply to the selected word line and writing given data in a plurality of memory cells connected to the selected word line; and generating a test signal to disconnect the internal boosted power supply from the word line and detecting a defect resulting from a leakage current flowing from the selected word line.

In the testing method for a semiconductor memory according to the present invention, the selected word line is tested by writing data other than the given data in the memory cells, connecting the internal boosted power supply to the word line, reading from the memory cells the data written therein, and judging whether the read data coincides with the written data.

The testing method for a semiconductor memory according to the present invention further comprises the steps of: when one of the plurality of word lines is selected therefrom, sequentially specifying the plurality of memory cells connected to the selected word line by selecting the respective column addresses thereof and writing the given data in the specified memory cells; and after the given data is written in the memory cell finally specified, generating the test signal to test the selected word line.

Since the present invention thus outputs the test signal in testing the selected word line to disconnect the internal boosted power supply from the selected word line, the output capacitance of the internal boosted power supply is disconnected from the word line and the word line has high impedance. This accelerates the voltage drop on the word line due to the leakage current flowing from the word line and reduces a time required to detect a defect resulting from the leakage current flowing from the word line as well as testing cost.

Moreover, since the presence of a leakage current path can surely be detected, a potential defect becoming more evident as the semiconductor memory deteriorates with time can be removed, which improves the reliability of the semiconductor memory.

In testing the selected word line, in particular, the word-line drive signal line is disconnected from the word line so that the capacitance of the word-line drive signal line as well as the output capacitance of the internal boosted power supply is disconnected from the word line. This further accelerates the voltage drop on the word line due to the leakage current and further reduces the time required to detect the defect resulting from the leakage current.

BRIEF DESCRIPTION OF THE DRAWINGS

The accompanying drawings illustrate the preferred embodiments of the present invention.

In the drawings.

DETAILED DESCRIPTION OF THE INVENTION

Referring now to the drawings, preferred embodiments of the present invention will be described.

(First Embodiment)

Figure 1:
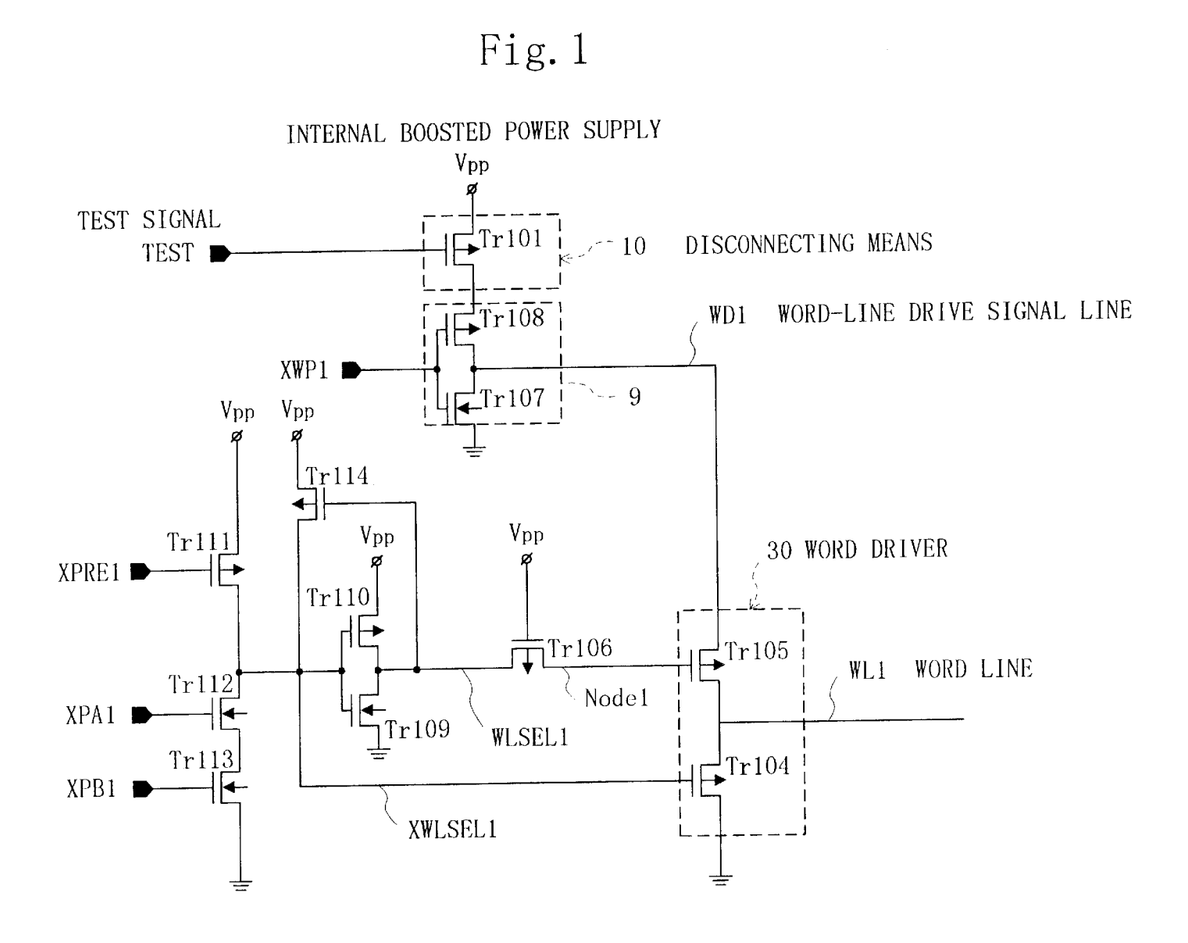
FIG. 1 shows the principal portion of a semiconductor memory according to a first embodiment of the present invention.

FIG. 1 shows a semiconductor memory according to a first embodiment of the present invention. The description of the overall structure of the semiconductor memory will be omitted, since it has already been given with reference to FIG. 2.

In FIG. 1 are shown: an internal boosted power supply Vpp; a word line WL1; and a word driver 30 composed of a word-line drive NMOS transistor Tr105 for driving the word line WL1 and a reset NMOS transistor Tr104 for grounding and resetting the word line WL1.

A word-line drive signal line WD1 is connected to the drain of the word-line drive NMOS Tr105. An inverter 9 composed of a PMOS transistor Tr108 and an NMOS transistor Tr107 is disposed between the internal boosted power supply Vpp and the word-line drive signal line WD1. The inverter 9 receives a precharge signal XWP1 and connects the internal boosted power supply Vpp to the word-line drive signal line WD1 when the signal XWP1 is on the "Low" level. For the sake of simplicity, only one word driver 3 is shown in FIG. 1. In an actual circuit, however, word drivers which are equal in number to the word lines are connected to the word-line drive signal line WD1.

Disconnecting means 10 is for disconnecting the internal boosted power supply Vpp from the word-line drive signal line WD1. The disconnecting means 10 is composed of a PMOS transistor Tr101 having a gate electrode (control terminal) receiving a test signal TEST generated from a test-signal generating circuit 19 shown in FIG. 3. In testing the word line, the test signal TEST on the "High" level is outputted to turn OFF the PMOS transistor Tr101 and thereby disconnect the internal boosted power-supply Vpp from the word-line drive signal line WD1.

Under normal operation, the test signal TEST from the test-signal generating circuit 19 is fixed to the "Low" level and the PMOS transistor Tr101 of the disconnecting means 10 is in the ON state.

Figure 3:
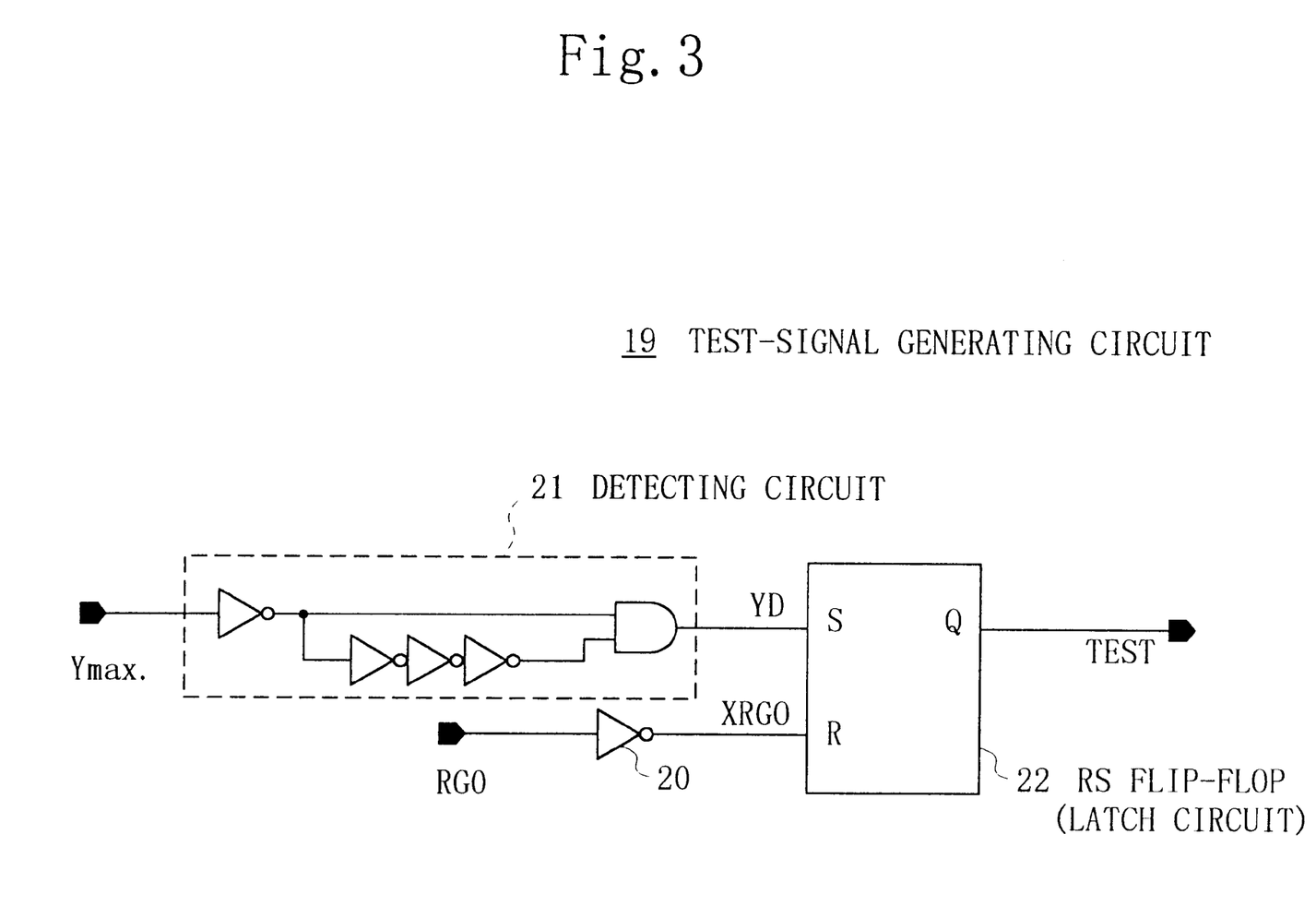
FIG. 3 shows a specific structure of a test-signal generating circuit provided in the semiconductor memory according to the first embodiment.
Figure 4:
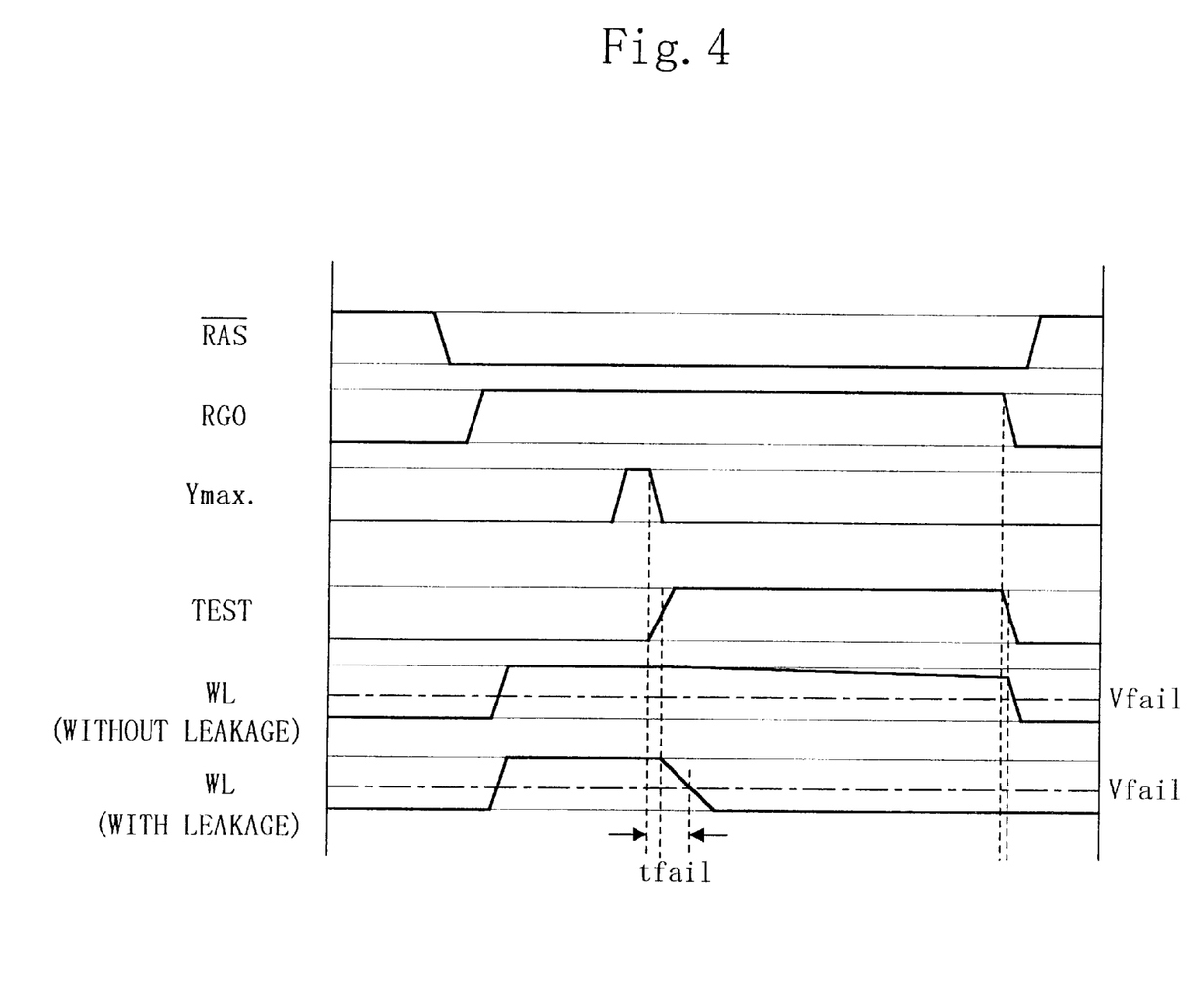
FIG. 4 shows an operational timing chart for the test-signal generating circuit of the semiconductor memory according to the first embodiment.

A description will be given to the internal structure of the test-signal generating circuit 19 shown in FIG. 3 with reference to the timing chart shown in FIG. 4. In the test-signal generating circuit 19 shown in FIG. 3, a signal RGO is generated based on an external control signal /RAS and inverted by the inverter 20 to form an inversion signal XRGO, as shown in FIG. 4. A signal Ymax. is from a specified column address select line, e.g., from a column address select line for selecting a maximum column address and inputted to a detecting circuit 21. The detecting circuit 21 detects the falling edge of the signal Ymax. to detect the selection of the specified column address and outputs an edge detect signal YD.

The edge detect signal YD is inputted to the set terminal S of an RS flip-flop (latch circuit) 22, while the inversion signal XRG is inputted to the reset terminal R of the RS flip-flop 22. As shown in FIG. 4, an output from the output terminal Q of the RS flip-flop 22 shifts from the "Low" level to the "High" level in synchronization with the rising edge of the edge detect signal YD (i.e., the falling edge of the signal Ymax.) and shifts from the "High" level to the "Low" level by using the rising edge of the inversion signal XRGO as a reset signal (i.e., the falling edge of the signal RGO) and in synchronization with the reset signal. The test signal TEST is an output signal from the output terminal Q.

When the column select signal (external control signal) /RAS shifts to the "Low" level and an address for selecting the word line WL1 is fetched, a precharge signal XPRE1 shifts to the "High" level, which turns OFF the PMOS transistor Tr111 receiving the precharge signal XPRE1. At the same time, predecode addresses XPA1 and XPB1 shift to the "High" level, which turns ON the two NMOS transistors Tr112 and Tr113 receiving the respective predecode signals XPA1 and XPB1. As a result, a potential at a node XWLSEL1 shifts to the "Low" level and is inputted to the gate of the word-line reset NMOS transistor Tr104 to turn OFF the transistor Tr104. The "Low" potential at the node XWLSEL1 is inputted to the gates of the NMOS transistor Tr109 and PMOS transistor Tr110 composing the inverter and inverted thereby to form an inversion signal WLSEL1 on the "High" level, which is inputted to the drain of an NMOS transistor Tr106 for self-booting. The source of the NMOS transistor Tr106 for self-booting is connected to a node Nodel, which is connected to the gate electrode (control terminal) of the word-line drive NMOS transistor Tr105. At the same time as the inversion signal WLSELI shifts to the "High" level, the potential at the node Nodel also shifts to the "High" level.

Subsequently, the precharge signal XWPL shifts to the "Low" level, which turns ON the PMOS transistor Tr108 of the inverter 9 and connects the internal boosted power supply Vpp to the word-line drive signal line WD1. At that time, the transistor Tr106 for self-booting has been cut off and the potential at the node Nodel is boosted by self-booting due to the gate capacitance of the word-line drive NMOS transistor Tr105. Consequently, a voltage loss due to the threshold voltage of the gate of the word-line drive NMOS transistor Tr105 does not occur when the potential on the word-line drive signal line WD1 is transmitted to the word line WL1 through the word-line drive NMOS transistor Tr105. Hence, the potential on the word line WL1 is increased to the potential from the internal boosted power supply Vpp.

It is to be noted that a PMOS transistor Tr114 for latching is turned ON to latch the "High" potential at the node XWLSEL1 in response to the inversion signal WLSEL1 on the "Low" level when the word line WL1 is unselected, i.e., when the precharge signal XPRE1 and the predecode addresses XPA1 and XPB1 are on the "Low" level.

In testing the word line, the test signal TEST shifts to the "High" level, which turns OFF the transistor Tr10 of the disconnecting means 10, so that the potential is no more supplied from the internal boosted power supply Vpp to the word-line drive signal line WD1 and the word line WL1 has high impedance. As for the other components, they operate in the same manner as in the normal state as described above.

A description will be given next to a testing method for the word line WL1. After forcing the external control signal /RAS to the "Low" level, the word line WL1 to be tested is selected. Then, given data (e.g., data on the "Low" level) is written sequentially in a plurality of memory cells (designated by the reference numeral 2 in FIG. 2) connected to the selected word line, while changing column addresses. When the final column-address select line is selected and the writing of data in the corresponding memory cell is completed, the detecting circuit 21 detects the falling edge of the signal Ymax. and the RS flip-flop 22 outputs the test signal TEST in synchronization with the detect signal from the detecting circuit 21 to disconnect the internal boosted power supply from the selected word line. As a result, the selected word line has high impedance.

Subsequently, the test signal TEST is forced to the "High" level to cut off the supply of power to the word line WL1 and disconnect the internal boosted power supply from the word line WL1. Then, after a given period of time has elapsed, data other than the data on the "Low" level, i.e., data on the "High" level is written sequentially in the plurality of memory cells connected to the selected word line WL in the same cycle.

After the writing of the data in each of the memory cells connected to the selected word lines is completed, the external control signal /RAS is temporarily forced to the "High" level to cancel the selection of the selected word line and thereby cancel the test mode. Thereafter, the same word line is selected again such that the data written in the memory cells connected to the word line is read therefrom. In this case, the test mode has not necessarily set in. If the read data is on the "High" level and correct, i.e., if the read data coincides with the written data, it follows that data has been written correctly irrespective of the word line at high impedance. Therefore, it is judged that there is no leakage current flowing from the word line. Conversely, if the read data is on the "Low" level and erroneous, i.e., if the read data does not coincide with the written data, it follows that the data on the "High" level has not been written properly in the memory cells due to a rapid potential drop on the word line caused by a leakage current. Therefore, it is judged that there is a leakage current flowing from the word line.

Figure 5:
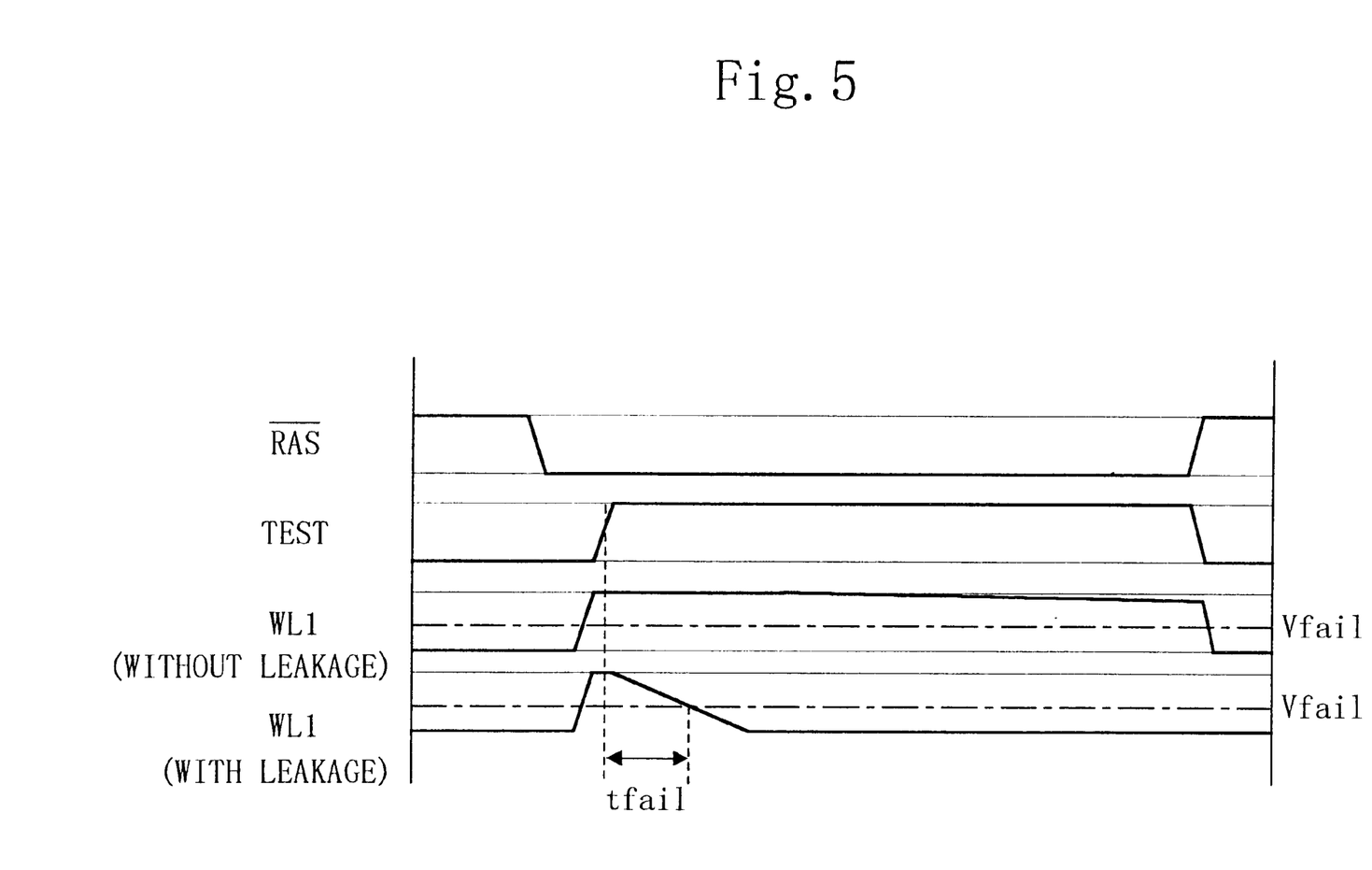
FIG. 5 shows an operational timing chart for the semiconductor memory according to the first embodiment.

FIG. 5 shows a timing chart during the testing of the word line and the transition of the potential on the word line. After the test signal TEST has been inputted, no power is supplied to the word line WL1 so that the potential on the word line WL1 is substantially constant when no leakage current is flowing from the word line WL1 but the potential on the word line drops rapidly when a leakage current is flowing from the word line WD1 due to a defect or the like. In the drawing, Vfail represents a reduced voltage reached by the potential on the word line at which data cannot be written in the memory cells any more and tfail represents a time interval between the inputting of the test signal TEST and the reaching of the potential on the word line to the reduced voltage Vfail at which the memory malfunctions.

A description will be given to the effect of a reduction in testing time by using a 16 Mb DRAM which is prevalent at present. In accordance with the method wherein the operation of the internal boosted power supply is halted, the reaching of the word-line potential to the reduced voltage Vfail requires about 1.3 ms due to the output capacitance of the internal boosted power supply described above. In accordance with the method of the present invention, by contrast, the capacitance connected to the word line is composed only of the capacitance of the word line itself and of the capacitance of the word-line drive signal line. Since the capacitance of the word-line drive signal line is approximately 2.4 pF, if it is assumed that the word line has a capacitance of 2.3 pF, a leakage current of 1 $\mu$A is flowing, and the potential on the word line drops by 1.6 v to the voltage Vfail, the time tfail required by the potential on the word line to drop to Vfail is about 11 $\mu$s, so that the testing time is reduced to about 1% of the testing time required by the conventional method.

(Second Embodiment)

Figure 6:
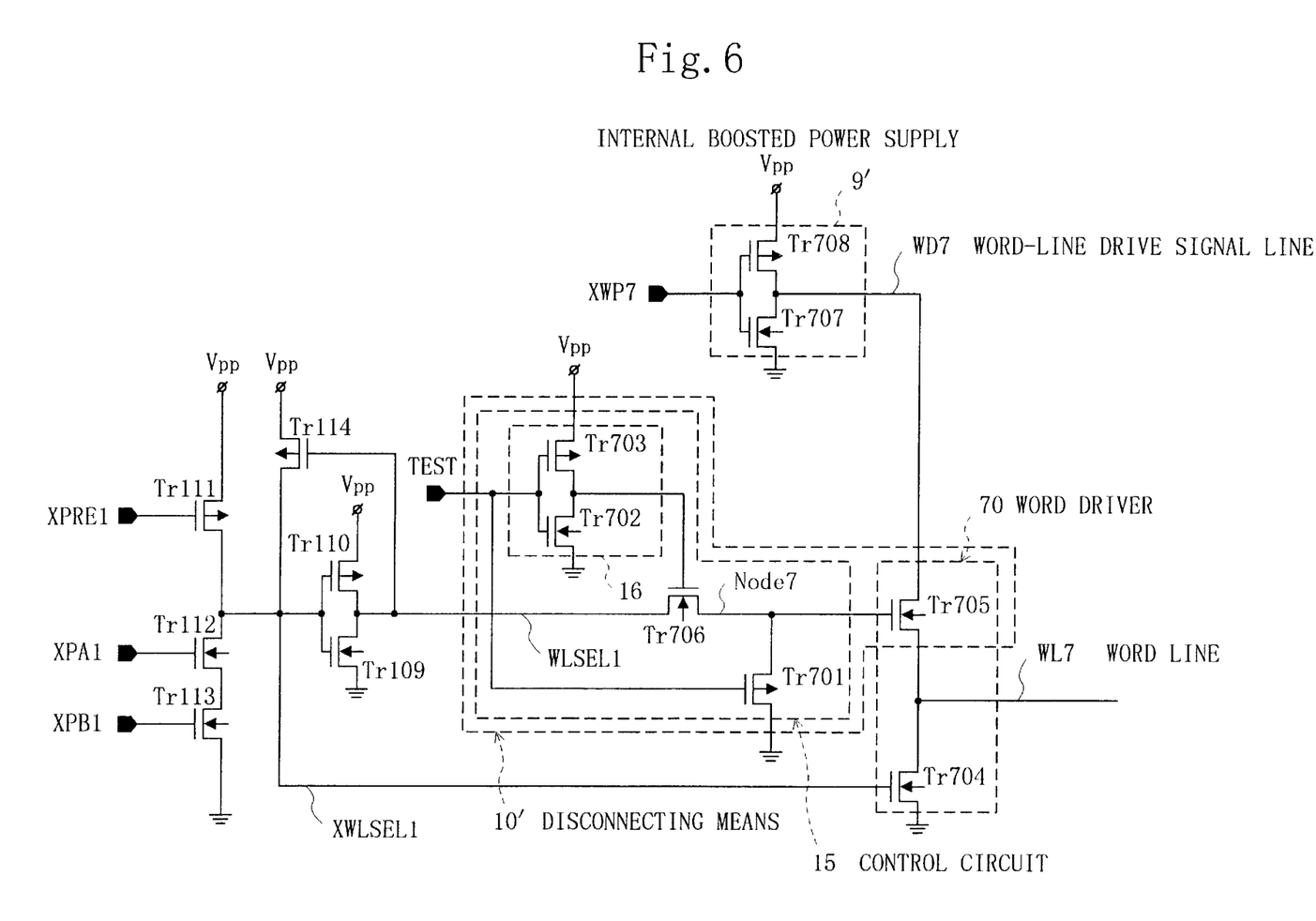
FIG. 6 shows the principal portion of a semiconductor memory according to a second embodiment of the present invention.

FIG. 6 shows a semiconductor memory according to a second embodiment of the present invention.

In the drawing are shown: a word line WL7; and a word driver 70 composed of a word-line drive NMOS transistor Tr705 for driving the word line WL7 and a reset NMOS transistor Tr704 for grounding the word-line WL7. A node Node7 is connected to the gate electrode of the word-line drive NMOS transistor Tr705. An inverter 9' is composed of a PMOS transistor Tr708 and an NMOS transistor Tr707.

Disconnecting means 10' including the word-line drive NMOS transistor Tr705 has an internal control circuit 15. The control circuit 15 has an NMOS transistor Tr706 for self-booting which is normally in the ON state, an NMOS transistor Tr701 for grounding and resetting the potential at the gate electrode (control terminal) of the word-line drive NMOS transistor Tr705, i.e., the potential at the node Node7, and an inverter 16 composed of an NMOS transistor Tr702 and a PMOS transistor Tr703. The inverter 16 receives a test signal TEST from a test-signal generating circuit 19 shown in FIG. 3. In response to the test signal TEST on the "High" level, the inverter 16 produces an output on the "Low" level, which turns OFF the NMOS transistor 706 for self-booting. The NMOS transistor Tr701 is turned ON in response to the test signal TEST on the "High" level, which turns OFF the word-line drive NMOS transistor Tr705 by grounding the potential at the node Node7. At that time, the word-line reset NMOS transistor Tr 704 is in the OFF state, while the two transistors Tr705 and Tr704 of the word driver 70 are in the OFF state. The description of the other components will be omitted by providing the same reference numerals, since they are the same as shown in FIG. 1.

Hence, when the test signal TEST shifts to the "High" level in testing the word line, the NMOS transistor Tr701 of the control circuit 15 is turned ON. On the other hand, an output from the inverter 16 of the control circuit 15 shifts to the "Low" level, which turns OFF the transistor Tr706 for self-booting. Consequently, charges are withdrawn from the node Node7 and the potential at the node Node7 shifts to the "Low" level, which turns OFF the word-line drive NMOS transistor Tr705 and disconnects a word-line drive signal line WD7 from the word line WL7. As a result, a voltage from the internal boosted power-supply Vpp is no more applied to the word line WL7. The timing chart for the individual signals is the same as shown in FIG. 5.

Compared with the first embodiment, the present embodiment achieves a further reduction in testing time since the word-line drive signal line WD7 is disconnected from the word line WL7 so that only the capacitance of the word line WL7, which is approximately 2.3 pF, functions as an effective load capacitance against a leakage current flowing from the word line.

(Third Embodiment)

Figure 7:
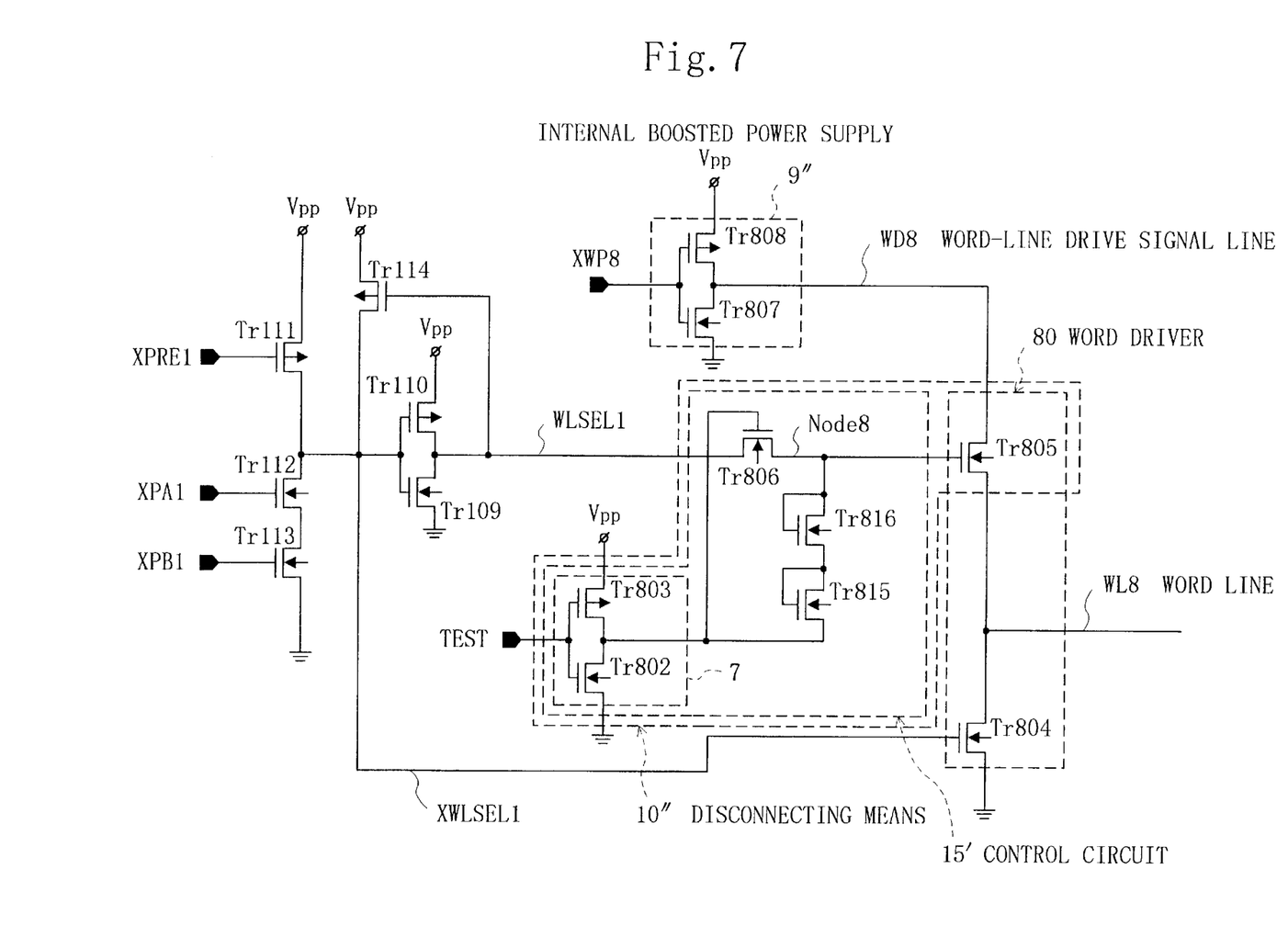
FIG. 7 shows the principal portion of a semiconductor memory according to a third embodiment of the present invention.

FIG. 7 shows a semiconductor memory according to a third embodiment of the present invention.

In the drawing are shown: a word line WL8; and a word driver 80 composed of a word-line drive NMOS transistor Tr805 for driving the word line WL8 and a reset NMOS transistor Tr804 for grounding the word line WL8. A node Node8 is connected to the gate electrode (control terminal) of the word-line drive NMOS transistor Tr805.

Disconnecting means 10" includes the word-line drive NMOS transistor Tr805 and a control circuit 15'. The control circuit 15' has an NMOS transistor Tr806 for self-booting which is normally in the ON state, two NMOS transistors Tr815 and Tr816, and an inverter 17 composed of an NMOS transistor Tr802 and a PMOS transistor Tr803. The NMOS transistor Tr816 has a gate and a drain each connected to the node Node8 and a source connected to each of the gate and drain of the NMOS transistor Tr815. The source of the NMOS transistor Tr815 is connected to the output terminal of the inverter 17, which receives a test signal TEST from a test-signal generating circuit 19 shown in FIG. 3. The description of the other components will be omitted by providing the same reference numerals, since they are the same as shown in FIG. 1.

When the test signal TEST shifts to the "High" level in testing the word line, the NMOS transistor Tr806 for self-booting of the control circuit 15' is turned OFF, while the two NMOS transistors Tr815 and Tr816 are turned ON simultaneously, so that charges are withdrawn from the node Node8 through the NMOS transistor Tr802 of the inverter 17. This reduces the potential at the node Node8 to a value corresponding to the sum 2 VT of the respective threshold voltages VT (e.g., 0.5 v) of the two transistors Tr816 and Tr815. Since the potential at the gate electrode of the word-line drive NMOS transistor Tr805, i.e., the potential at the node Node8 corresponds to the sum 2 VT of the respective threshold voltages, the word-line drive NMOS transistor Tr805 remains in the OFF state till the potential at the source electrode thereof, i.e., the potential on the word line WL8 is reduced to a value lower than the potential at the gate electrode thereof by the value of the threshold voltage VT, i.e., to the threshold voltage VT, which disconnects the word-line drive signal line WD8 from the word line WL8. The timing chart for the individual signals is the same as shown in FIG. 5. Since the present embodiment has used the same principle of operation as used in the second embodiment, the word line WL8 can be tested in substantially the same testing time as required by the second embodiment.

We claim:

1. A semiconductor memory comprising:
    a memory cell array having a large number of memory cells arranged in rows and columns;
    a plurality of word lines each provided for an individual row of said memory cell array, each of said word lines being connected to those of said memory cells arranged in one of said rows;
    an internal boosted power supply for supplying a boosted voltage higher than an external power-supply voltage;
    a word-line drive signal line connected to said internal boosted power supply when any of said word lines is activated;
    a word driver connecting, when one of said plurality of word lines is selected therefrom based on a row address, said word-line drive signal line to the selected word line; and
    disconnecting means for disconnecting said internal boosted power supply from said selected word line in response to a test signal after said word line is selected.

2. A semiconductor memory according to claim 1, wherein said disconnecting means disconnects said internal boosted power supply from said word-line drive signal line.

3. A semiconductor memory according to claim 2, wherein said disconnecting means is composed of a transistor connected to a current path extending between said internal boosted power supply and said word-line drive signal line, said transistor being turned OFF in response to said test signal inputted to a control terminal of the transistor.

4. A semiconductor memory according to claim 1, wherein said disconnecting means disconnects said word-line drive signal line from said selected word line.

5. A semiconductor memory according to claim 4, wherein said disconnecting means comprises a control circuit for turning OFF said word driver in response to said test signal.

6. A semiconductor memory according to claim 1, 2, 4, or 5, further comprising a test-signal generating circuit for generating said test signal in synchronization with the selection of a specified column address.

7. A semiconductor memory according to claim 6, wherein said test-signal generating circuit comprises:
    a detecting circuit for detecting the selection of said specified column address; and
    a latch circuit for receiving a detect signal from said detecting circuit and outputting said test signal in synchronization with the detect signal.

8. A semiconductor memory according to claim 7, wherein said latch circuit is reset in response to a reset signal and stops outputting said test signal.

9. A semiconductor memory according to claim 8, wherein said reset signal is generated when the selection of the selected word line is cancelled.

10. A testing method for a semiconductor memory, comprising the steps of:
    when one of a plurality of word lines is selected therefrom, connecting an internal boosted power supply to said selected word line and writing given data in a plurality of memory cells connected to said selected word line; and
    generating a test signal to disconnect said internal boosted power supply from said word line and detecting a defect resulting from a leakage current flowing from said selected word line.

11. A testing method for a semiconductor memory according to claim 10, wherein said selected word line is tested by writing data other than said given data in said memory cells, connecting said internal boosted power supply to said word line, reading from said memory cells said data written therein, and judging whether the read data coincides with said written data.

12. A testing method for a semiconductor memory according to claim 10 or 11, further comprising the steps of:
    when one of said plurality of word lines is selected therefrom, sequentially specifying the plurality of memory cells connected to said selected word line by selecting the respective column addresses thereof and writing the given data in the specified memory cells; and
    after the given data is written in the memory cell finally specified, generating said test signal to test said selected word line.

13. A testing method for a semiconductor memory according to claim 10 or 11, wherein the generation of said test signal is halted when the selection of said selected word line is canceled.

* * * * *